United States Patent [19]

Stickel et al.

[11] Patent Number: 5,712,488

[45] Date of Patent: Jan. 27, 1998

[54] ELECTRON BEAM PERFORMANCE MEASUREMENT SYSTEM AND METHOD THEREOF

[75] Inventors: Werner Stickel, Ridgefield, Conn.; Christopher Frederick Robinson, Hyde Park, N.Y.

[73] Assignee: International Business Machines Corporation, Armonk, N.Y.

[21] Appl. No.: 725,665

[22] Filed: Oct. 1, 1996

[51] Int. Cl.⁶ .................................................. H01J 37/304
[52] U.S. Cl. ............................... 250/492.23; 250/491.1
[58] Field of Search ........................... 250/492.23, 491.1

[56] References Cited

U.S. PATENT DOCUMENTS 5,404,019   4/1995   Ohno et al. ..................... 250/492.23

*Primary Examiner*—Jack I. Berman
*Attorney, Agent, or Firm*—Schmeiser, Olsen & Watts; Steven J. Soucar

[57] ABSTRACT

A electron beam performance measurement system includes an electron beam generator device for producing an electron beam, a test reticle having a series of openings forming a pattern, a reduction projection imaging device, a reference target having an essentially identical pattern as the test reticle, and a beam current detector. A patterned beam is generated by passing the electron beam through the pattern openings of the test reticle. The patterned beam is reduced and projected by the reduction projection imaging device and the reduced patterned beam is imaged onto a reference target. The reduced patterned beam is then exposed to the reference target, wherein some of the beam may pass through reference target pattern openings. Beam current detector records and measures the amount of beam current that is absorbed on, back-scattered from, or transmitted by the target reference, and determines from the measured beam current the accuracy of the projection system.

20 Claims, 6 Drawing Sheets

ELECTRON BEAM PERFORMANCE MEASUREMENT SYSTEM AND METHOD THEREOF

BACKGROUND OF THE INVENTION

1. Technical Field

The invention relates generally to electron beam technology, and more specifically, to electron beam projection systems.

2. Background Art

The proliferation of modern electronics can be traced back in time to the invention of the integrated circuit, or semiconductor "chip". Over the years, advances in integrated circuit manufacturing processes have greatly increased the functionality of chips. A typical chip is fabricated on a semiconductor substrate, and patterns of conducting layers and insulating layers are formed by a series of deposit and etch process steps.

The generation of the pattern on the semiconductor substrate on any of these layers is referred to in the industry as "lithography". Lithography is the exposure of a resist (a radiation-sensitive thin film covering the substrate) with an energy-bearing radiation. The radiation causes a change in the chemical properties of the resist so that the areas in the film, which were exposed to the radiation, respond to the application of a developer substance differently than those areas that were not exposed. Depending on the resist material, this response could be either a reduced or increased solubility in the developer ("negative" or "positive" resist, respectively). Nonetheless, both cases create a relief or topographical structure in the resist layer, such that radiation exposed areas of the substrate are resist free after development or visa versa. The remaining resist then acts as a mask for subsequent deposition or etch processing.

In the environment of high volume production of ultra large scale integrated (ULSI) circuitry, the radiation used at present is typically visible and ultraviolet light (UV), with the associated equipment being projection systems in most application. However, this technology eventually reaches a fundamental limit of application to lithography of patterns with ever smaller dimensions (referred to hereafter as "critical dimensions (CD)"). Techniques envisioned to replace the use of UV light beyond this limit include x-rays a well as particle beams (i.e., ions and electrons).

Electron beam (E-beam) lithography has been in use for close to thirty years, but almost exclusively with using probe beams, i.e., beams with a diameter not exceeding a few micrometers. The technique of a probe beam system is comparable to drawing a pattern with a pen. Although most of the tools of a probe beam system do project the image of a stencil reticle reduced in size onto the substrate, this reticle does not contain a "pattern", only a single (rectangular) opening. This single opening imaging represents a fundamental difference between the probe beam system and systems called "projection" systems. In projection systems the reticle contains the pattern of the entire chip or large portions of it, large compared to the CD by at least three orders of magnitude.

E-beam projection systems are considered an alternative for the follow-on technology of light optics. While in principle, E-beam systems operate in a manner quite similar to a light-optical system, E-beam systems require special techniques for calibration and alignment. Some techniques for calibrating and aligning probe-forming E-beam systems are found in the following U.S. Patents: U.S. Pat. No. 4,675,528, "Method for Measurement of Spotsize and Edgewidth in Electron Beam Lithography", issued June 1987 to Langner et al.; U.S. Pat. No. 4,503,334, "Method of Using an Electron Beam", issued March 1985 to King et al.; U.S. Pat. No. 4,737,646, "Method of using an Electron Beam", issued April 1988 to King et al.; U.S. Pat. No. 5,466,549, "Method of Detecting and Adjusting Exposure Conditions of Charged Particle Exposure System", issued November 1995 to Yamada; and U.S. Pat. No. 5,438,207, "Electron Beam Direct Writing System for ULSI Lithography with Facilitated Rotation and Gain Corrections of Shot Patterns and Electron Beam Direct Writing Method for Same", issued August 1995 to Itoh et al.

One specific method to focus patterns on the reference target and/or to correct system problems, such as rotational errors, is disclosed in the aforementioned Langner et al. reference. The system discussed in the Langner et al. reference scans a beam spot across the sharp edge of the reference target to measure the image quality of the spot generated by the probe-forming system in terms of size, shape orientation, and edge acuity. The beam spots generated by the probe-forming system must meet certain specifications within very close tolerances. The process of scanning a beam across a sharp edge of the reference target and measuring the beam current, the current measured from the electrons, found on the surface of the reference target is known as knife edge scanning (KES).

Although the above-mentioned KES techniques are used successfully in probe-forming systems, there is not enough beam current density for precision measurement of image quality in a large-area projection system. That is, despite the higher total beam current in a projection system (more than an order of magnitude), the current in a section of the image on the reference target commensurate with the critical dimension (CD) in the pattern is low. Hence, the signal-to-noise (S/N) ratio is so small that all the aforementioned methods are rendered ineffective in a projection system.

Accordingly, a need has developed in the art for a method and system for measuring system performance with respect to image quality in large-area E-beam projection systems.

SUMMARY OF THE INVENTION

It is thus an advantage of the present invention to provide an E-beam performance measurement system that measures image quality.

The foregoing and other advantages of the invention are realized by an electron beam performance measurement system that comprises an electron beam generator device for producing an electron beam, a test reticle having a series of openings forming a pattern, a reduction projection imaging device, a reference target having an essentially identical pattern as the test reticle, and a beam current detector. A patterned beam is generated by passing the electron beam through the pattern openings of the test reticle. The patterned beam is reduced in size by the reduction projection imaging device and the reduced patterned beam is imaged onto a reference target, wherein some of the beam may pass through reference target pattern openings. The beam current detector records and measures the amount of beam current that is either absorbed on, back-scattered from, or transmitted through the target reference.

The present invention allows for a projection system to measure image edge-acuity, size, shape (distortion), and orientation. These measurements are possible because, first, the test reticle is essentially the same as the reference target, and second, the entire or a large fraction of the current in the beam is used at the target.

The foregoing and other advantages and features of the invention will be apparent from the following more particular description of preferred embodiments of the invention, as illustrated in the accompanying drawings.

BRIEF DESCRIPTION OF THE DRAWINGS

The preferred exemplary embodiments of the present invention will hereinafter be described in conjunction with the appended drawings, where like designations denote like elements, and.

DETAILED DESCRIPTION OF THE DRAWINGS

Figure 1:
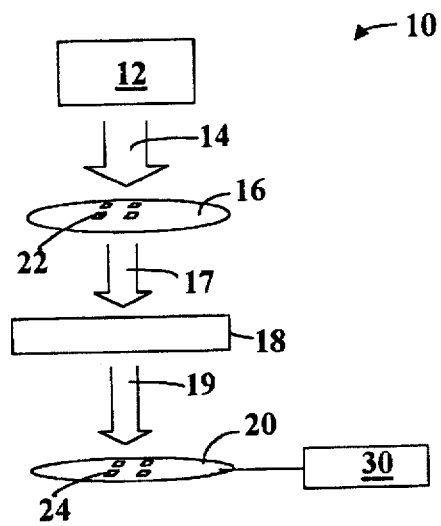
FIG. 1 is a block diagram of a performance measurement system in accordance with a preferred embodiment of the present invention.

Referring to FIG. 1, an electron-beam (E-beam) performance measurement system 10 in accordance with an embodiment of the present invention is disclosed. Although this patent is discussed in context with E-beams, one skilled in the art can see that similar systems with other radiation sources and beams may also be used. The E-beam performance measurement system 10 comprises an electron beam generating device 12, a test reticle 16, reduction projection imaging device 18, reference target 20, and beam current measuring device 30.

Electron beam generating device 12 generates electron beam 14, which is received by test reticle 16. On test reticle 16 are a series of rectangular openings 22, forming a pattern. A patterned beam 17 is created by the electron beam 14 passing through test reticle 16. The patterned beam 17 is then reduced in size and projected by the reduction projection imaging device 18 and the reduced patterned beam 19 is imaged onto the reference target 20. Reference target 20 also comprises a pattern made up of a series of rectangular openings 24. The pattern of reference target 20 is essentially the same as the pattern of test reticle 16, thus, avoiding systematic (positional) deviations between reticle and target of the positions of the openings relative to each other. That is, when the reduced patterned beam 19, which is a regular array of small rectangular sub-images, is scanned across reference target 20 with the identical, but not reduced pattern, the edges of the sub-images will cross their corresponding reference target pattern edges at the same time as not to blur the measurement. Creating "identical" patterns is best served when both test reticle 16 and reference target 20 are fabricated by the same lithography machine, preferably at the same time on the same substrate as close together as possible, and subsequently processed simultaneously.

The reason for splitting the projected area into an array of separate and small openings is two-fold. First, the integrity of the pattern edge cannot be maintained usually over distances that are large compared to the CD of the circuit patterns to be projected. Second, using an array of openings facilitates distortion measurements of the entire area, which is crucial for projection systems.

Reduced patterned beam 19 is then exposed to the reference target 20, wherein some of the beam 19 may pass through reference target pattern openings 24. Beam current detector 30 records and measures the amount of beam current that is either absorbed on, back-scattered from, or transmitted through target reference 20. All three techniques may be used simultaneously, or, as illustrated in the example below, individually.

Figures 2, 3:
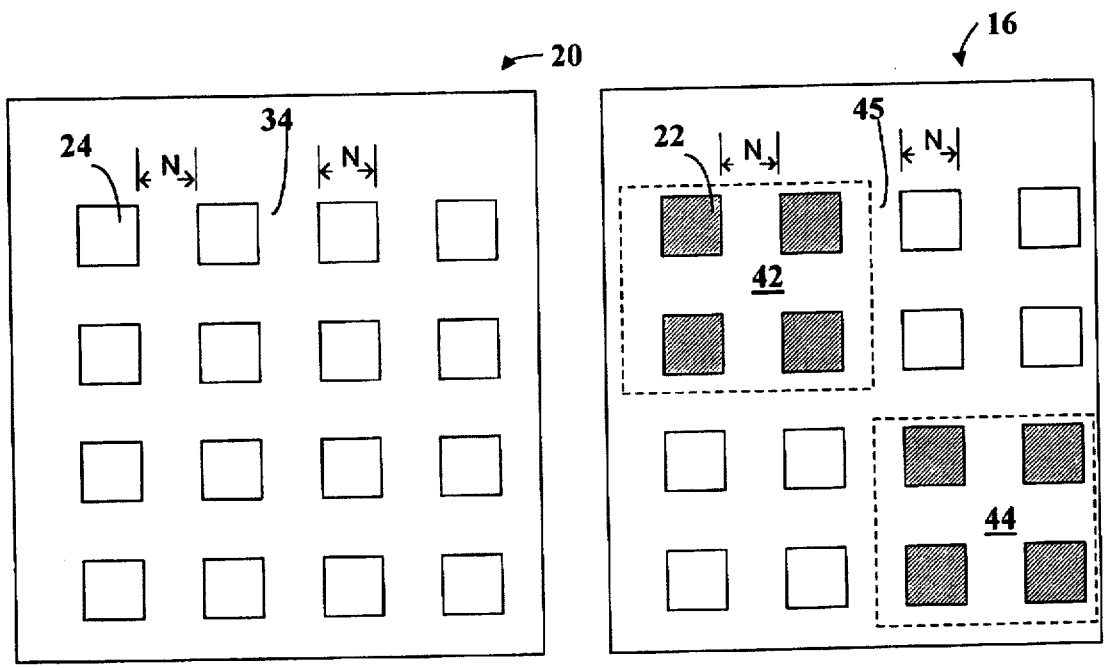
FIG. 2 is an exemplary diagram of the reference target of FIG. 1.
FIG. 3 is an exemplary diagram of the test reticle of FIG. 1.

FIG. 2 illustrates an exemplary pattern created on reference target 20 (FIG. 1) consisting of a basic array of squares. Although this particular pattern is illustrated, it is to be understood that other patterns of different size openings and shapes (e.g., rectangles, parallelograms) may be used. Both the reference target and the test reticle (shown in FIG. 3) are typically made from a conductive substrate to transmit the current from the beam to the beam current detector 30 in the case of measuring the absorbed current, and to prevent charging of the substrate when the other two of the aforementioned detection methods are used. The pattern openings 24 are each generally within the range of 3 to 15 micrometers (um) in width N and the space 34 between the openings within the range of 3 to 15 um. In this particular example, N=8 um.

An exemplary pattern of test reticle 16 (FIG. 1) is illustrated in FIG. 3. As aforementioned, the pattern of test reticle 16 is basically identical to the pattern of reference target 20, with 8 um openings 22 and 8 um spaces 45. Regions 42 and 44, however, are not opened up in test reticle 16 to provide different periodicities. For edge slope measurement, the periodicities have to be laid out in an integer ratio to the demagnification or reduction factor of the projection system. This ratio is not necessary for the measurement of the demagnification, rotation and distortion of the projected image, as will be discussed below.

Figure 4:
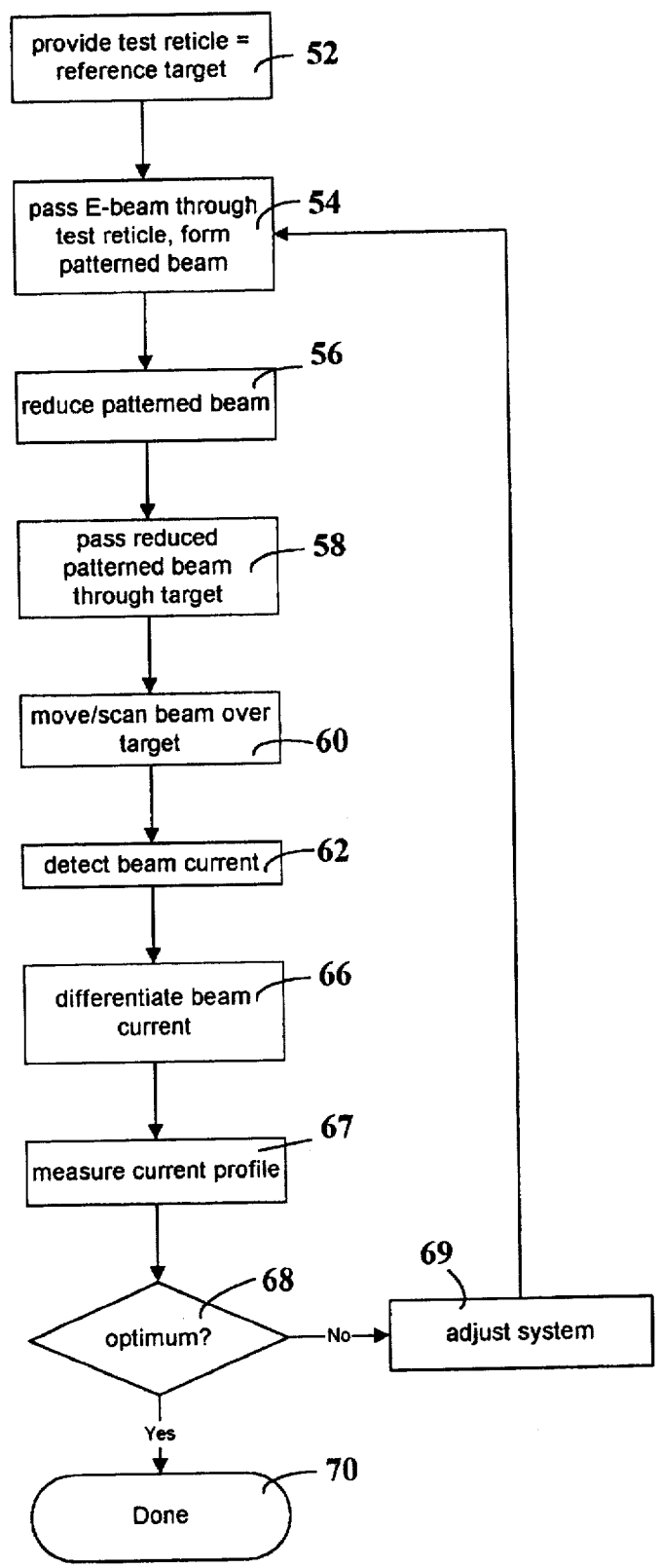
FIG. 4 is a flow diagram illustrating the method used for the performance measurement system of FIG. 1.

As seen in FIG. 4, a flowchart illustrates the method of measuring the performance of an E-beam projection system. As aforementioned, the first step is providing a test reticle that, except for regions 42 and 44, has essentially the same pattern layout as the reference target (step 52). There are basically two options in providing a test reticle for the system. For the first option, the test reticle and reference target patterns are substantially identical in size. Then, the image of the former, which is scanned across the target (as seen in subsequent steps), is smaller than the latter by the system demagnification factor. For the second option, the test reticle pattern size is larger than the reference target pattern by a fraction larger or smaller than the system reduction factor. For example, if the system reduction factor was four, then the test reticle pattern size could be in the range of 3.8 to 4.2 times greater than the reference target pattern. Thus, the images of the test reticle openings are slightly over-filling the reference target openings.

Figure 6:
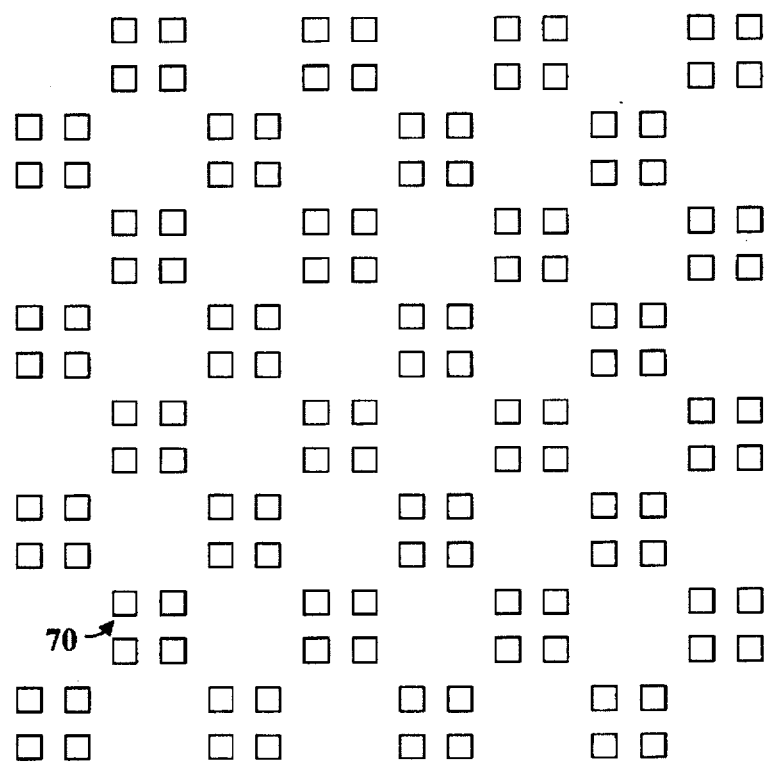
FIG. 6 is an exemplary diagram illustrating the reduced image of the test reticle of FIG. 1.

The E-beam generating device then generates an E-beam, which passes through the test reticle creating multiple patterned beamlets (step 54). The multiplicity of beamlets, or, for short, the patterned beam is then reduced in size by a predetermined amount (step 56). Although reducing the patterned beam by a factor of three to five in size is the reduction amount predetermined by technology considerations, other reductions may be made. FIG. 6, for example, illustrates the resulting image when the patterned beam is reduced to one-fourth its original size. The original size is, in this example, the same as that of the target pattern, corresponding to the first option as described above. The advantage of the first option is having the closest possible resemblance of test reticle and reference target. The disadvantage is scanning a higher number of image corners across one edge simultaneously. The advantage of the second option, as discussed above, would be the minimization of the impact of image corners on the measured edge width. A potential disadvantage could be the dissimilarity of the edges due to the size and possible distortion of the enlarged test reticle pattern edge.

Figure 7:
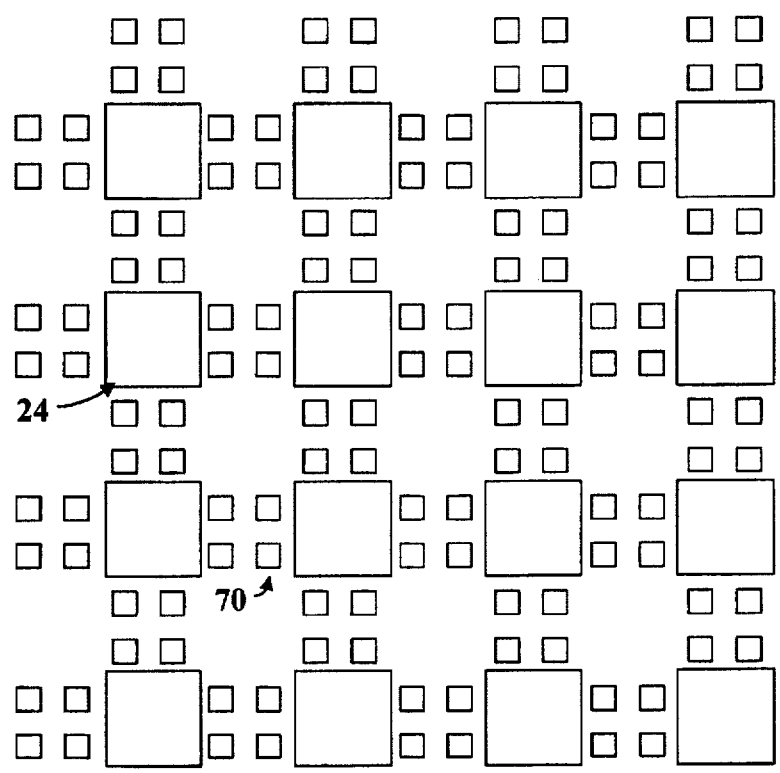
FIGS. 7, 8, 9 and 10 are exemplary resulting diagrams of the test reticle image scanned upon the reference target of FIG. 1 in accordance to the present invention.
Figure 8:
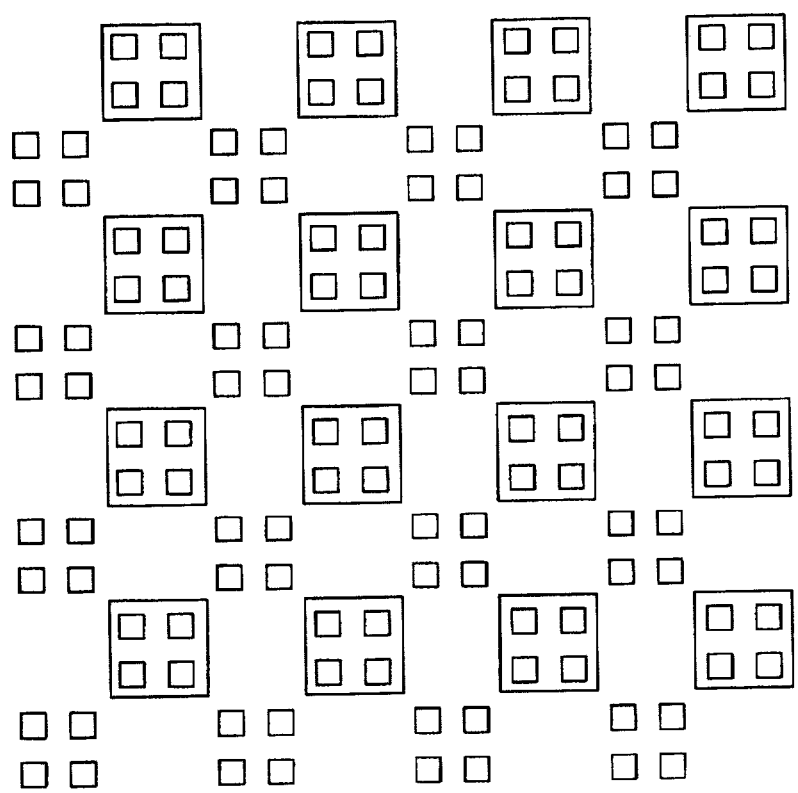

Continuing on with FIG. 4, the reduced patterned beam is exposed to the reference target (step 58), then moved across by electric or magnetic deflection of the electrons (step 60), whereby some of the beam passes through reference target pattern openings. FIGS. 7 and 8 illustrate two such positions of the reduced patterned beam when the system is calibrated properly. FIG. 7 illustrates a first position of the reduced patterned beam on the reference target, with one-hundred percent beam current absorbed, and FIG. 8 illustrates a second position of the reduced patterned beam on the reference target, with fifty percent beam current absorbed. As shown in FIG. 4, the amount of beam current absorbed, back-scattered or transmitted by the reference target is measured and recorded (step 62) as the reduced patterned beam moves over the reference target (step 60). These steps (step 60 and 62) are similar to the typical KES technique. When the measurements are completed, a differential waveform may optionally be formed from the recorded beam current (step 66). The direct and/or differential waveforms of the beam current are evaluated, and if optimized (step 68=yes) the testing is completed. If the waveforms show less than an optimum profile (step 68=no), the projection system needs to be adjusted (step 69), and tested again (to step 54).

Figure 5A:
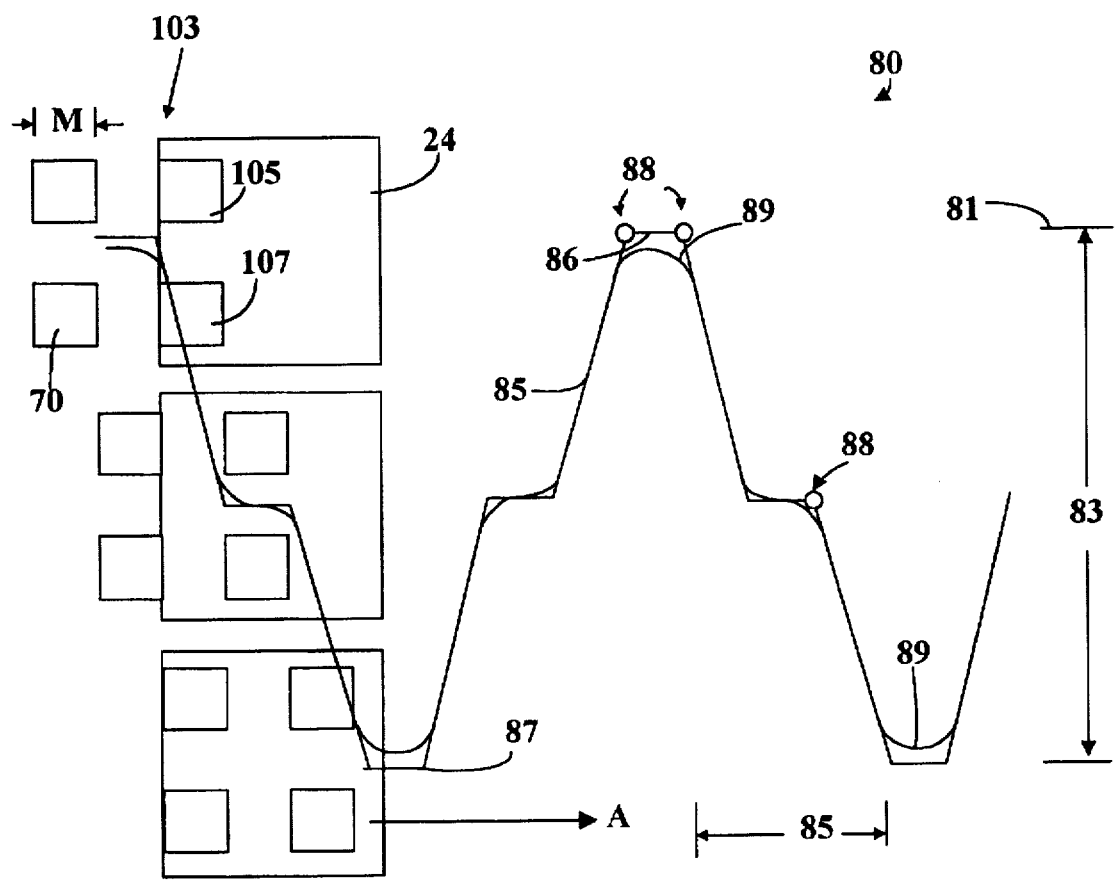
FIGS. 5A and 5B are exemplary diagrams of a modified KES technique and resulting waveforms used for FIG. 1 in accordance with an embodiment of the present invention.
Figure 5B:
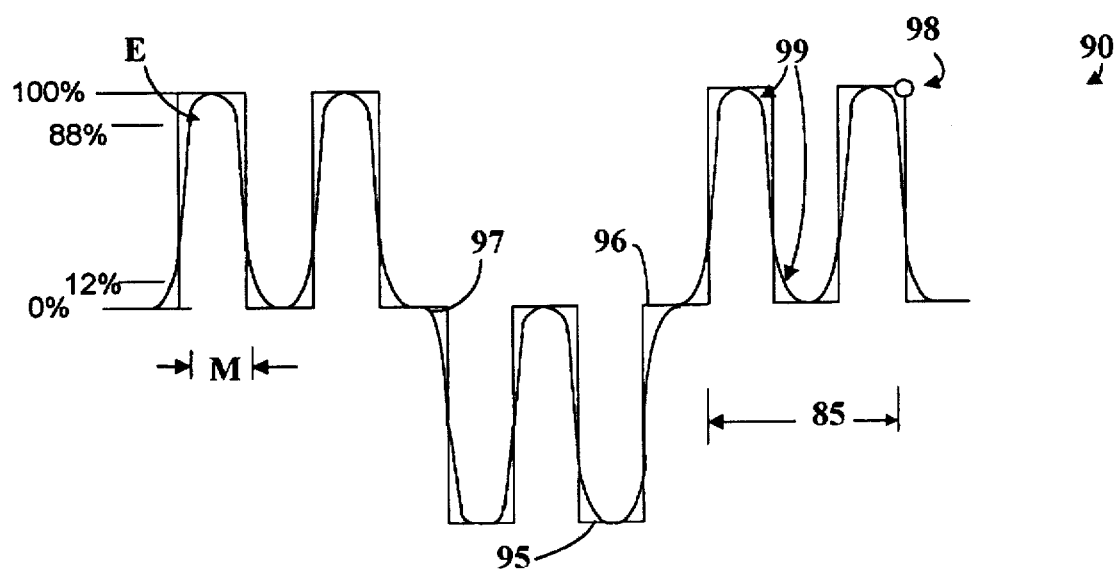

FIGS. 5A and 5B further illustrate the modified KES method as described above. The waveforms (signals) shown in FIGS. 5A and 5B are produced with a calibrated system using the test reticle of FIG. 3. The beam current in this example is measured by the amount of beam current absorbed on the target reference. As shown in FIG. 5A, as the reduced patterned beam 70 moves over the reference target 24 in direction A, a beam current signal 80 is produced. For this example, the peak 86 of signal 80 corresponds to 100 percent of the beam current being absorbed (as shown in FIG. 7). The minimum amount absorbed, which in this example is 50% (see FIG. 8), is represented by the bottom curve 87 of signal 80. The condition of optimum system adjustment is derived from the amplitude and shape of the directly recorded beam current signal 80. In particular, the relevant criteria include: the level of maximum current 81, the difference between maximum and minimum recorded current 83 ("signal swing"), and the sharpness (88, 89) and slope of the transition between levels 87 and 86. These criteria determine the S/N ratio, shape, height and width, respectively, of the electronically differentiated waveform 90 (FIG. 5B), which serves to extract these properties for more accurate characterization.

In this example, the signal swing 83 is one-half of the total beam current at the reference target. The maximum target current 81 is only one-fourth of the current impinging on and transmitted through the test reticle (the test reticle is therefore referred to as carrying a "twenty five percent pattern density"). As a general rule, maximum signal and signal swing are correlated and have to be traded off, the higher the amplitude, the smaller the swing.

The slope of the absorbed current swing is determined by the width of the test reticle pattern openings M, represented also by the width of the differential signal M (FIG. 5B). A criterion for the minimum useful extension or highest steepness of this slope is given by the sharpness 88 (or lack thereof 89) of the transition between the level of constant signal (e.g. 86) and the sloping signal (e.g., 85). If chosen too small, these transitions at the top and the bottom levels would overlap each other, therefore partially obscure each other and also reduce the height of the differential signal. The "sharpness" 88 or "roundness" 89 of the transition between constant 86 and sloping signal 85 is caused by several factors described below affecting the patterned beam generated by the test reticle and processed by the imaging device (the electron optics of the system).

As seen in FIG. 5B, the transitions between the constant 86 and sloping signal 85 (FIG. 5A) is reflected by the shape 98, 99, and in particular the edge width M of differential signal 90. The generally adopted measurement of the edge width is the timely separation of the points on the differential signal, where it reaches 12% and 88% of its amplitude. The smaller this displacement, the better the (intrinsic and adjusted) performance of the system. Constant signals 95, 96 and 97 on the differential signal 90 correspond to signals 85, 86, and 87, respectively, on the beam current signal 80 of FIG. 5A.

The example for FIGS. 5A and 5B shows that two beamlets (e.g., 105 and 107) of the reduced patterned beam simultaneously traverse an edge 103 in any one opening in the reference target. Accordingly, four image corners are associated with each edge measurement. Since any corner is generated by two blurred image edges, more corners per edge measurement tend to slightly increase the apparent blur. This can be avoided by, for example, using enlarged rectangles for the reticle openings, but at the cost of dissimilarity between test reticle and reference target pattern. Both choices are considered of similar, but little impact on the measurement of the true system performance.

The reliability of the edge width measurement M crucially depends on the beamlets traversing the edges of their associated openings in the reference target simultaneously or, more realistically, within a time interval small compared to that corresponding to the image edge slope E. Assuming that test reticle and reference target are virtually identical with respect to size, shape and separation (pitch) of the openings, the system factors that affect the measured edge width will be edge acuity (resolution), (de)magnification, rotation and distortion.

Resolution

The resolution of the projection system means the higher and the sharper the edge (the steeper the edge slope E) is of any of the beamlet images on the reference target, the closer these beamlets may be placed. For example, in the case of a circuit pattern, as the resolution sharpens, the features can be placed closer together and still be discerned. The resolution is determined first by proper adjustment of the basic imaging condition, the focus of the lens system comprising the imaging device. Optimum focus adjustment would preferentially be measured not by determining the smallest signal transition directly, but extrapolating the minimum from a multitude of measurements, each at a different magnification setting. This technique potentially improves the overall measurement uncertainty by relying more on the sensitivity and symmetry of the system dependency on misadjustment rather than on the S/N ratio of any individual measurement.

Secondly, the resolution is ultimately determined by the intrinsic optical performance capability of the system. Any electron or light optical system always causes resolution limiting image blur of a major or minor severity depending on the design and operation of the system. One familiar with the art speaks of "optical aberrations" and, in the case of charged particles, additional "image blur due to Coulomb interactions" between the particles. Therefore, the directly recorded signal transition will never be exactly sharp and the differential signal 90 will never be exactly rectangular, or in mathematical language, discontinuous.

The following factors, while affecting the measured edge width similarly to the image blur, are manifestations of beamlets displacement from nominal conditions relative to each other due to magnification and distortion errors in the system, and relative to the reference target due to rotation.

Magnification

Figure 9:
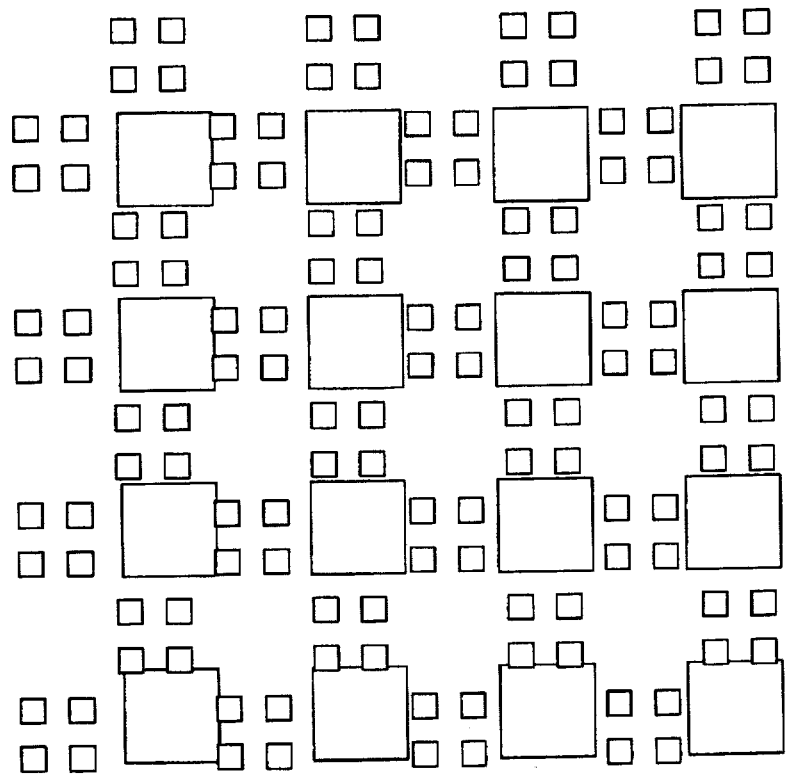

Proper magnification of the system is indicated by the simultaneous crossing of the beamlets of the reduced patterned beam traversing the edges of the reference target openings. The reduction factor has to be an integer multiple or fraction of the pitch of the test reticle and target openings. Any deviation increases the edge width of the differential signal. FIG. 9 illustrates the case of misadjusted magnification. The resulting absorbed beam current will be less than one-hundred percent. FIGS. 7 and 8 shows the case of properly adjusted magnification.

Rotation

Figure 10:
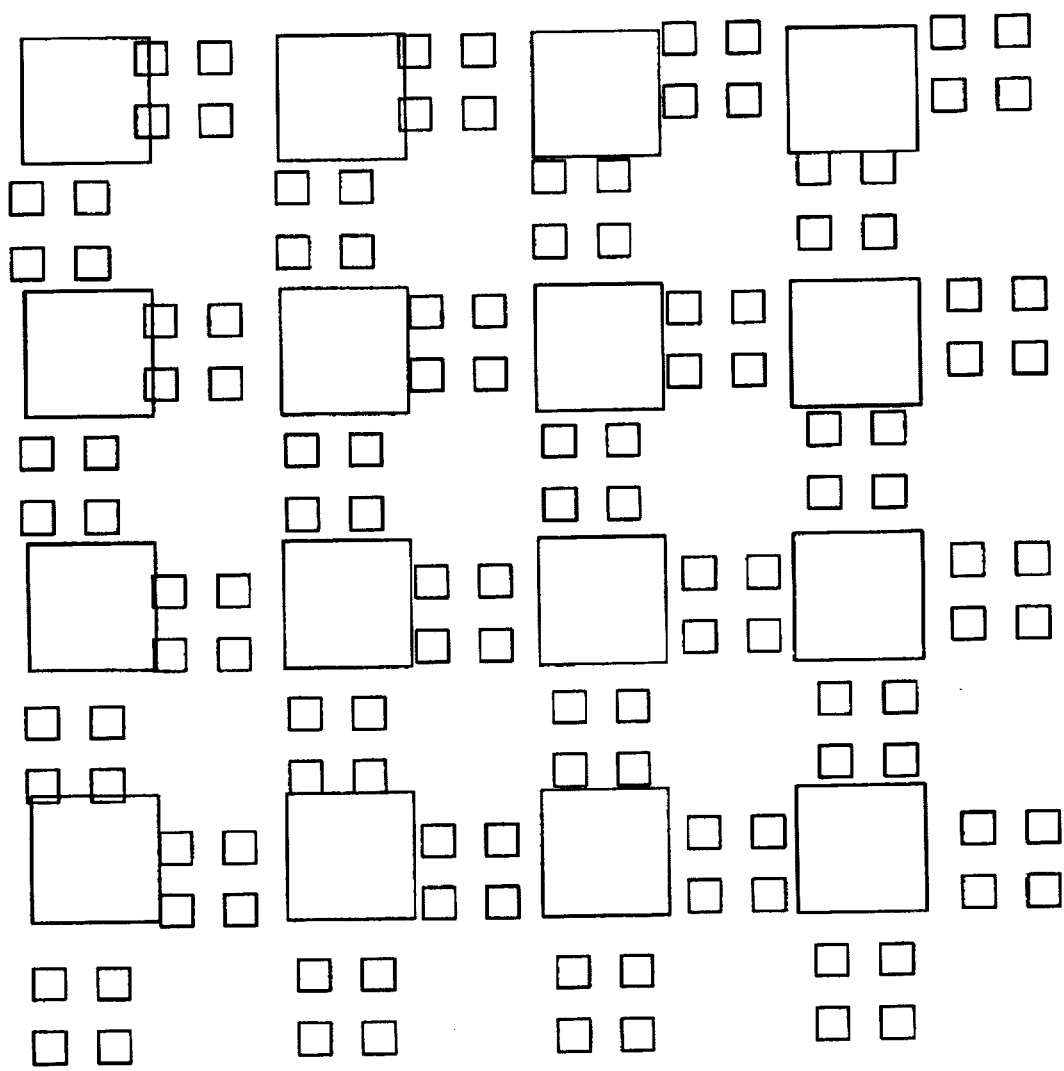

Misrotation can be caused by mechanical misalignment between the test reticle and reference target and/or, in case of magnetic lenses being employed in the imaging device, misadjustment of the lens strengths. FIG. 10 illustrates a case of misrotation. With the modified KES technique utilizing all beamlets simultaneously, rotation generally cannot be discriminated from magnification misadjustment. One would preferentially first minimize the measured edge width by adjusting rotation with the above procedure, then adjust magnification for further improvement, potentially repeating both adjustments iteratively.

Both magnification and rotation adjustment would preferably be facilitated by using the same technique as described above for the focus adjustment. Furthermore, for magnification and rotation measurement, the sensitivity of the modified KES method as described above is proportional to the size of the image. Therefore, in comparison to a probe-forming system with a spot of a few um dimension, the simultaneous scan of many comparable sub-images or 'spots', the array of which is covering an area of approximately several 100 um on edge increases the measurement precision be a corresponding factor. The measurement criteria would be the same as that of the edgewidth measurement, namely the shape of the differential waveform 90. Obviously, the rotational and demagnification adjustments have to precede the edgewidth measurement. The optimum adjustment of the system may be found by measuring the edge slopes of the differential signal at various settings (of magnification and/or rotation and/or focus) above and below the approximate optimum setting, approximating these data points with an "above" curve and a "below" curve by regression analysis, and determining the optimum at the intersections of the two curves.

Distortion

Regarding the distortion measurement, several components need to be considered. Parallelogram distortion (orthogonality error) can be treated as rotational error, albeit as different in x and y direction. Trapezoidal, as well as barrel and pin-cushion distortion, require comparison of magnification measurements utilizing not all, but fractions of beamlets in various section of the array, e.g., on the top/left and bottom/right as well as in the center of it. In this case, the loss of total current in the image could be compensated by increasing the primary current impinging on the reticle section, as the corresponding blur of the edgewidth would affect all sections equally. An additional requirement for this measurement, however, is the need for either multiple test reticle sections, or a shaping capability of the electron beam generating device. That is, providing multiple beam current detectors to measure the beam current in more than one area on said reference target. Then, the measurements of the beam current are electronically differentiated to find edge widths for more than one differential waveform, and the system is adjusted for distortion when the edge widths are different.

Thus, the disclosed invention provides accurate image edge acuity and size/shape information over a large area, while providing a high S/N ratio at the reference target. This is possible by providing essentially the same test reticle as reference target and by scanning many relatively small rectangular sub-images across multiple knife edges of not much greater length simultaneously. The corresponding signals, either of the absorbed, transmitted or back-scattered electron current, are then summed to provide a good S/N ratio.

By calibrating an E-beam system, or a similar system with a different radiation source, through the methods aforementioned, the E-beam performance measurement system is beneficial to the production of semiconductor devices.

While the invention has been particularly shown and described with reference to a preferred embodiment thereof, it will be understood by those skilled in the art that the foregoing and other changes in form and details may be made therein without departing from the spirit and scope of the invention.

What is claimed is:

1. An electron beam performance measurement system comprising:

a test reticle, having a series of openings that form a pattern, for producing a patterned beam when a radiation beam passes through said pattern;

a demagnification device, capable of receiving said patterned beam, for generating a reduced patterned beam by reducing said patterned beam size;

a reference target having a series of openings that form a pattern, for receiving said reduced patterned beam from said demagnification device; and a beam current detector, capable of receiving said reduced patterned beam, for measuring the amount of beam current from said reduced patterned beam that is absorbed on, back-scattered from, or transmitted through said reference target.

2. The system of claim 1, wherein said radiation beam is an electron beam.

3. The system of claim 1, wherein said patterned beam is reduced by a reduction factor ranging from about three to about five in size.

4. The system of claim 1, wherein the reduced patterned beam covers an area larger than approximately 100 micrometers on edge.

5. The system of claim 1, wherein said openings are substantially rectangular.

6. The system of claim 5, wherein the substantially rectangular openings are substantially square.

7. The system of claim 1, wherein said pattern of said test reticle is substantially the same as said pattern of said reference target.

8. The system of claim 3, wherein said pattern of said test reticle is larger than the reference target pattern by a fraction larger than the reduction factor.

9. A semiconductor device manufactured with a radiation source tested with the system of claim 1.

10. A method for measuring the performance of an electron beam projection system comprising the steps of:
 a) passing an electron beam through a test reticle having a pattern formed from a series of openings, thereby forming a patterned beam;
 b) reducing said patterned beam to form multiple reduced patterned beams;
 c) imaging said multiple reduced patterned beams simultaneously on a reference target;
 d) deflecting said reduced patterned beams across said reference target while measuring a resulting absorbed, back-scattered, or transmitted beam current of said reference target; and
 e) determining performance and accuracy of the operation of said system through said measured beam current.

11. The method of claim 10, wherein step b) further comprises the step of: reducing said patterned beam by a factor ranging from about three to about five in size.

12. The method of claim 10, wherein step e) further comprises the step of: electronically differentiating said measurement of said beam current to find a differential waveform having an edge slope and an edge width.

13. The method of claim 12, further comprising the step of: adjusting said system for sharper resolution when said edge slope of said differential waveform shows less than the steepest optimum slope angle and highest optimum amplitude.

14. The method of claim 13, further comprising the step of: adjusting said system for magnification and rotation when said edge width of said differential waveform is not equal to a factor of a width of said opening of said reference target.

15. The method of claim 10, further comprising the steps of:
 providing multiple beam current detectors to measure said beam current in more than one area on said reference target;
 electronically differentiating said measurements of said beam current to find edge widths for more than one differential waveform; and
 adjusting said system for distortion when said edge widths different.

16. The method of claim 14, further comprising the steps of:
 measuring said edge slope of said differential waveform at settings above and below optimum settings for said resolution, magnification and rotation;
 approximating said edge slope measurements to form a first curve and a second curve; and
 determining an optimum adjustment at the intersection of said first curve and said second curve.

17. An electron beam projection system having a performance measurement system, said projection system comprising:
 a test reticle, having a series of openings that form a pattern, for producing a patterned beam when an electron beam passes through said pattern;
 a demagnification device, capable of receiving said patterned beam, for generating a reduced patterned beam by reducing said patterned beam size;
 a reference target having a series of openings that form a pattern, for receiving said reduced patterned beam from said demagnification device; and
 a beam current detector, capable of receiving said reduced patterned beam, for measuring the amount of beam current from said reduced patterned beam that is absorbed on, back-scattered from, or transmitted through said reference target.

18. The projection system of claim 17, wherein said patterned beam is reduced in size by a reduction factor ranging from about three to about five.

19. The projection system of claim 17, wherein said pattern of said test reticle is substantially the same as said pattern of said reference target.

20. The projection system of claim 17, wherein said pattern of said test reticle is larger than the reference target pattern by a fraction larger than the reduction factor.

* * * * *